United States Patent
La Rosa

(10) Patent No.: US 6,507,221 B2
(45) Date of Patent: Jan. 14, 2003

(54) CIRCUIT FOR THE FILTERING OF PARASITIC LOGIC SIGNALS

(75) Inventor: Francesco La Rosa, Rousset (FR)

(73) Assignee: StMicroelectronics S.A., Montrouge (FR)

(*) Notice: Subject to any disclaimer, the term of this patent is extended or adjusted under 35 U.S.C. 154(b) by 0 days.

(21) Appl. No.: 09/938,289

(22) Filed: Aug. 23, 2001

(65) Prior Publication Data

US 2002/0113643 A1 Aug. 22, 2002

(30) Foreign Application Priority Data

Aug. 24, 2000 (FR) .......................................... 00 10884

(51) Int. Cl.[7] .............................................. G01R 29/02
(52) U.S. Cl. ........................................ 327/34; 327/558
(58) Field of Search ........................... 327/34, 551, 552, 327/553, 558

(56) References Cited

U.S. PATENT DOCUMENTS

| | | | |
|---|---|---|---|
| 4,137,504 A | 1/1979 | Simmons | 328/165 |
| 4,599,525 A | 7/1986 | Tzeng | 307/234 |
| 5,821,782 A * | 10/1998 | Carloni et al. | 327/105 |
| 5,834,968 A | 11/1998 | Imamiya | 327/552 |
| 5,907,250 A | 5/1999 | Baizley et al. | 327/18 |
| 6,133,782 A * | 10/2000 | Kattner et al. | 327/341 |

FOREIGN PATENT DOCUMENTS

EP 0687065 12/1995 ......... H03K/5/1252

* cited by examiner

*Primary Examiner*—Jeffrey Zweizig
(74) *Attorney, Agent, or Firm*—Lisa K. Jorgenson; Allen, Dyer, Doppelt, Milbrath & Gilchrist, P.A.

(57) ABSTRACT

A filtering circuit includes circuits for delivering first and second ramp-shaped signals when a logic signal to be filtered changes values, and includes logic circuits each with a switching threshold, for receiving the ramp-shaped signals. A memory unit delivers an output signal having a first value when outputs of the logic circuits have a first pair of values, and delivers a second value when the outputs of the logic circuits have a second pair of values. The filtering circuit may be applied to the filtering of an external clock signal in serial type memory devices.

26 Claims, 5 Drawing Sheets

CIRCUIT FOR THE FILTERING OF PARASITIC LOGIC SIGNALS

FIELD OF THE INVENTION

The present invention relates to integrated circuits, and more particularly, to a filtering circuit for filtering a logic signal having a duration below a threshold.

BACKGROUND OF THE INVENTION

In many applications, it is necessary to filter brief parasitic signals that may appear at the input terminals of an electronic device. If the electronic device is unable to process these signals, this could lead to its malfunctioning. This problem relates especially to electrically erasable and programmable memories receiving an external clock signal that sets the frequency of the read and/or write operations. These memories are serial memories connected to a bus I2C, for example.

Memories of this type are designed to operate with a clock frequency that should not exceed a maximum frequency specified by the manufacturer. When operating beyond this frequency, the internal logic circuit that controls the write or read operations can no longer follow the frequency imposed on it, and this may lead to operating errors. Operating errors include the writing of a erroneous piece of data in the memory or the accidental erasure of data.

The input stage of electronic devices such as these include a filtering circuit for filtering signals whose duration has a value below a determined threshold Tf. With such a filtering circuit, it should be possible not only to filter pulse trains comprising pulses with a duration smaller than Tf, but also isolated random pulses with a duration smaller than Tf.

There are known ways of providing RC type lowpass filters having a specific cutoff frequency. However, purely analog filters do not have an attenuation in the vicinity of their cutoff frequency that is sufficient for the efficient elimination of certain parasitic signals, such as isolated or random pulses which may cross the filtering barrier.

Another known approach is digital filtering. However, digital filtering requires means for sampling the signal received at input, and computation means to implement a filtering algorithm. In numerous applications, it is not possible to consider providing sampling and computation means of this kind solely for the purpose of filtering parasitic signals that may be received at an input terminal of an electronic device, given the cost and complexity of these means.

SUMMARY OF THE INVENTION

In view of the foregoing background, it is an object of the present invention to provide a method and a device for filtering a variation of a logic signal having a duration with a value below a filtering threshold Tf, especially for the filtering of random or recurrent parasitic pulse trains or isolated parasitic pulses.

Another object of the present invention is that the filtering should not require the intervention of digital computation means.

Yet another object of the present invention is that the filtering should be more efficient than low-pass analog filtering, and that the filtering should not let through parasitic signals whose duration has a value below the filtering threshold.

These and other objects, advantages and features according to the present invention are provided by a hybrid filter combining characteristics of analog circuits and characteristics of digital circuits. The analog circuit characteristics may include the generation of a ramp-shaped signal when a variation of the input signal is detected. The ramp-shaped signal gives a time base used as a reference for the filtering of a brief variation in the input signal. The ramp-shaped signal may be applied to a logic circuit having a switching threshold, the output of which is used to generate the output signal of the filter.

If the variation of the input signal disappears before the ramp has reached the switching threshold of the logic circuit, the ramp is reset and the output of the filter remains unchanged. Conversely, if the ramp reaches the threshold of the logic circuit before the variation in the input signal disappears, the output of the logic circuit changes its value and delivers a signal that copies the variation of the input signal.

More specifically, the present invention provides a filtering circuit for filtering a variation of a logic signal having a duration with a value below a predetermined threshold. The filtering circuit comprises means to deliver a first ramp-shaped signal when the logic signal goes from a first value to a second value, and for bringing the first signal back to its initial value when the logic signal goes from the second value to the first value. The filtering circuit further comprises means to deliver a second ramp-shaped signal when the logic signal goes from the second value to the first value, and for bringing back the second signal to its initial value when the logic signal goes from the first value to the second value.

A first logic circuit and a second logic circuit with a switching threshold, respectively receive the first and second signals at input. A memory is used to deliver an output signal having a first value when the signals delivered by the logic circuits have a first pair of values, and a second value when the signals delivered by the logic circuits have a second pair of values.

According to one embodiment, the memory comprises a first memory flip-flop circuit receiving at its resetting input the output of one of the logic circuits, and at its setting input the output of the other logic circuit. According to another embodiment, the memory comprises a second memory flip-flop circuit receiving an output of the first memory flip-flop circuit at its resetting input, and an inverted output of the first memory flip-flop circuit at its setting input. The output of the second memory flip-flop circuit forms the output of the filtering circuit.

According to another embodiment, the slopes of the ramps of the first and second signals are substantially identical, as are the switching thresholds of the first and second logic circuits. According to another embodiment, the means for delivering first and second signals each comprises a capacitor-charging or capacitor-discharging analog circuit, and a switch to discharge or recharge the capacitor when the first or second signal has to be brought back to its initial value.

According to another embodiment, the analog circuit delivering the first signal receives the inverted logic signal at an input, and the analog circuit delivering the second signal receives the logic signal at an input. According to another embodiment, the analog circuit delivering the first signal receives the output of the second logic circuit at an input, and the analog circuit delivering the second signal receives the output of the first logic circuit at an input.

According to yet another embodiment, the first and second logic circuits have a switching hysteresis, and the first and second circuits may be inverter circuits.

The present invention also relates to an integrated circuit comprising a filtering circuit as described above and configured as a buffer circuit at an input of an integrated circuit receiving an external clock signal.

The present invention also relates to a method for filtering a variation of a logic signal having a duration with a value below a predetermined threshold. The method comprises generating a first substantially ramp-shaped signal in response to a first type of variation of the logic signal, and bringing the first signal back to its initial value when the logic signal has a variation of a second type that is the reverse of the first one. A second substantially ramp-shaped signal may be generated in response to a variation of the second type of logic signal, and the second signal is brought back to its initial value when the logic signal has a variation of the first type.

The method further includes applying the first signal to a first logic circuit having a specified switching threshold, and a second signal to a second logic circuit also having a specified switching threshold. An output signal may be generated with a first logic value when the outputs of the two logic circuits have a first pair of values, and a second logic value when the outputs of the two logic circuits have a second pair of values. This is for keeping the output signal at its current value when the outputs of the two logic circuits have a pair of values different from the first and second pairs of values.

BRIEF DESCRIPTION OF THE DRAWINGS

These objects, features and advantages as well as other aspects of the present invention shall be explained in greater detail in the following description of an exemplary embodiment of a filtering circuit, given by way of a non-restrictive embodiment and made with reference to the appended figures, of which.

DETAILED DESCRIPTION OF THE PREFERRED EMBODIMENTS

Figure 1:
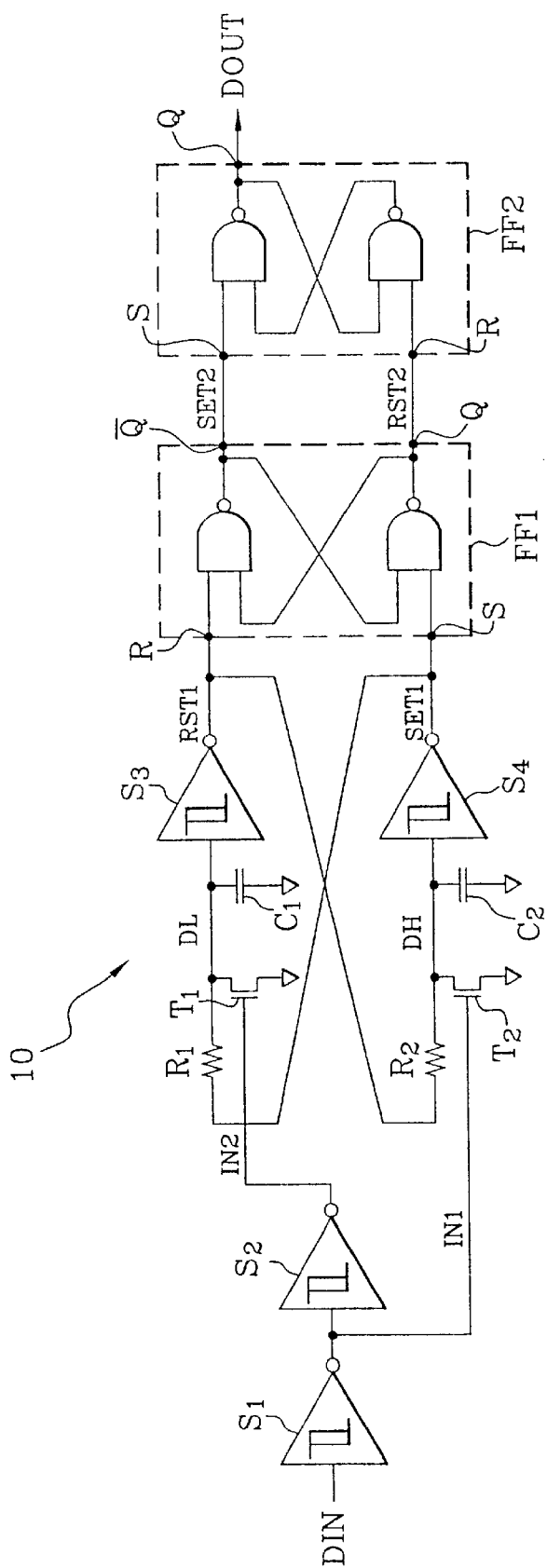
FIG. 1 is a schematic diagram of a filtering circuit according to the present invention.

A description of a filtering circuit according to the present invention will now be discussed. FIG. 1 shows a filtering circuit 10 according to the present invention receiving a signal DIN at its input and delivering a filtered signal DOUT at its output. The circuit 10 has two inverter gates S1 and S2, two resistors R1 and R2, two MOS transistor-switches T1 and T2, two capacitors C1 and C2, two logic circuits S3 and S4 having a switching threshold Vt, and two memory flip-flop circuits FF1 and FF2. The flip-flop circuits FF1 and FF2, are also known as R-S flip-flop circuits or S-C flip-flop circuits. Each flip-flop circuit comprises two two-input NAND gates, with each NAND gate having its output connected to an input of the other NAND gate.

The inverter gate S1 receives the signal DIN at its input, and delivers a signal IN1 that is applied to the input of the inverter gate S2 and to the gate of the transistor T2. The output of the inverter gate S2 delivers a signal IN2 that is applied to the gate of the transistor T1. One end of the resistor R1 is connected to the output of the logic circuit S4. The other end of the resistor R1 is connected to the drain of the transistor T1, and to the anode of the capacitor C1 and the input of the logic circuit S3. The cathode of the capacitor C1 and the source of the transistor T1 are connected to ground. Likewise, one end of the resistor R2 is connected to the output of the logic circuit S3, and the other end of the resistor R2 is connected to the drain of the transistor T2, and to the anode of the capacitor C2 and the input of the logic circuit S4. The cathode of the capacitor C2 and the source of the transistor T2 are also connected to ground.

The output of the logic circuit S3 delivers a signal RST1 applied to the R (reset) input of the flip-flop circuit FF1, and the output of the logic circuit S4 delivers a signal SET1 applied to the S (set) input of the flip-flop circuit FF1. The inverted $\overline{Q}$ output of the flip-flop circuit FF1 delivers a signal SET2 applied to the S input of the flip-flop circuit FF2, and the non-inverted Q output of the flip-flop circuit FF1 delivers a signal RST2 applied to the R input of the flip-flop circuit FF2. The output signal DOUT of the circuit 10 is taken at the Q output of the flip-flop circuit FF2.

The logic circuits S3 and S4 are inverter gates, preferably of the Schmitt trigger type, for providing a switching hysteresis. Thus, the output of each logic circuit S3 and S4 goes to 0 when the signal received reaches a threshold Vth, and goes to 1 when the signal received reaches a threshold Vt1 below Vth. As readily understood by one skilled in the art, a switching hysteresis of this kind is not indispensable to the implementation of the method of the invention, but can be used to ensure immunity to noise on the part of the filtering circuit 10. Preferably, the inverter gates S1 and S2 forming the input stage are also inverter Schmitt triggers and have a switching hysteresis wherein the voltage variations of the input signal DIN that do not correspond to a clear variation to a 1 or to a 0 are filtered.

Operation of the filtering circuit will now be discussed. In the filtering circuit 10, the elements R1, T1, C1 form a first ramp generator circuit that delivers a signal DL to the input of the logic circuit S3. This signal DL is ramp-shaped when the output of the logic circuit S4 goes to 1 (with the charging of the capacitor C1 by the resistor R1), and is brought to 0 by the transistor T1 when the output of the inverter gate S2 delivers a signal IN2 equal to 1 (the transistor T1 is on and discharges the capacitor C1).

Similarly, the elements R2, T2, C2 form a second ramp generator circuit that delivers a signal DH to the input of the logic circuit S4. This signal DH is ramp-shaped when the output of the logic circuit S3 goes to 1 (with the charging of the capacitor C2 by the resistor R2), and is brought to 0 by the transistor T2 when the output of the inverter gate S1 delivers a signal IN1 equal to 1 (the transistor T2 is on and discharges the capacitor C2).

The following Table 1 describes the static operation of the circuit 10 when the received signal DIN is stabilized.

TABLE 1

| DIN | IN1 | IN2 | DH | SET1 | DL | RST1 | RST2 | SET2 | DOUT |
|---|---|---|---|---|---|---|---|---|---|
| 0 | 1 | 0 | 0 | 1 | 1 | 0 | 0 | 1 | 0 |
| 1 | 0 | 1 | 1 | 0 | 0 | 1 | 1 | 0 | 1 |

Figure 2A:
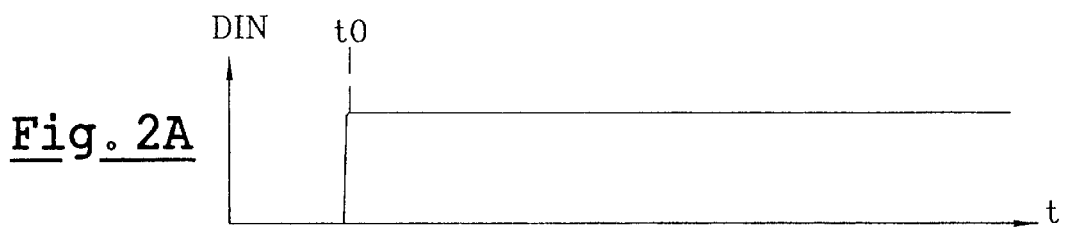
FIGS. 2A to 2E are plots showing electrical signals appearing in the filtering circuit of FIG. 1 for illustrating a first exemplary operation thereof.
Figure 2B:
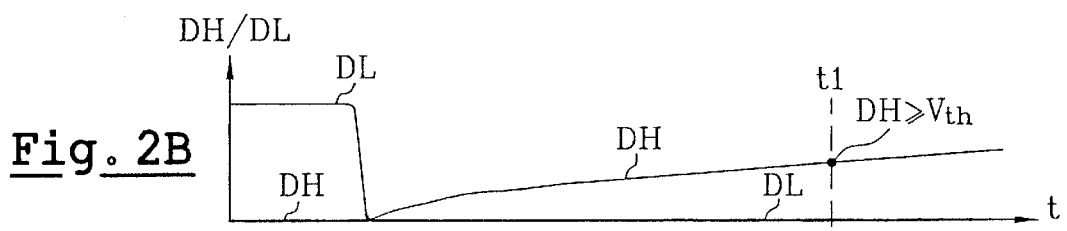
Figure 2C:
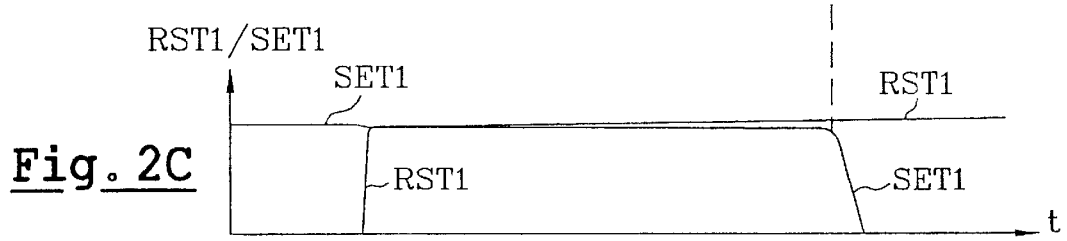
Figure 2D:
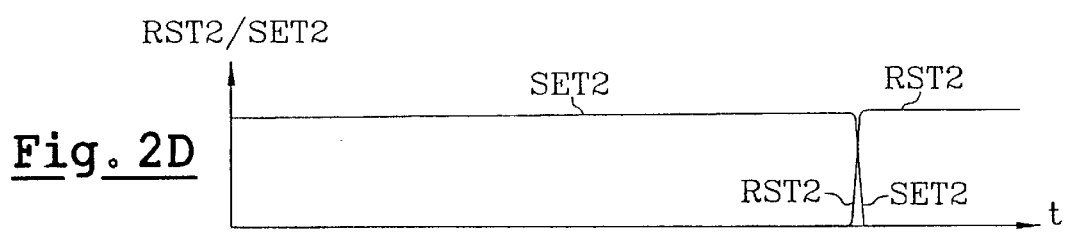
Figure 2E:
Figure 3A:
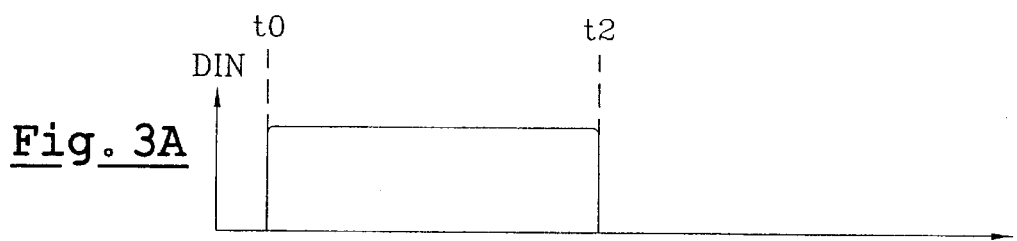
FIGS. 3A to 3E are plots showing the same signals in FIGS. 2A to 2E for illustrating a second exemplary operation of the filtering circuit.
Figure 3B:
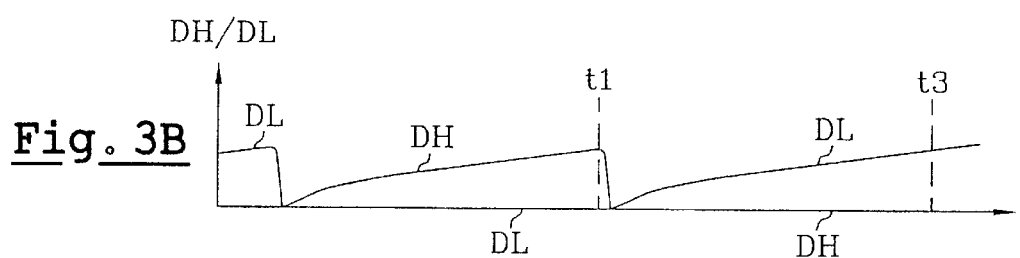
Figure 3C:
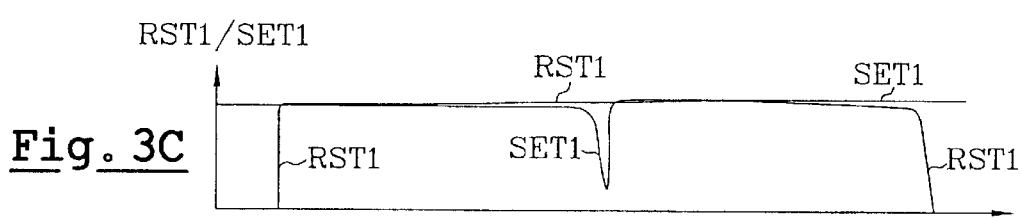
Figure 3D:
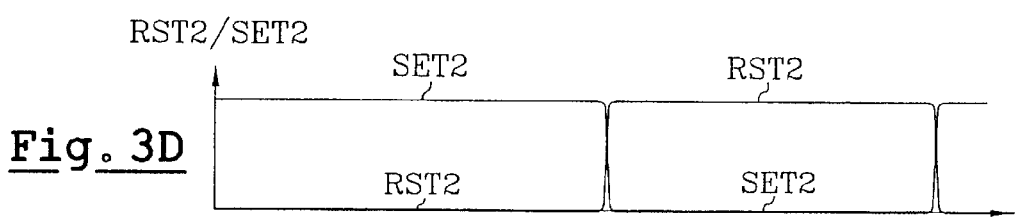
Figure 3E:
Figure 4A:
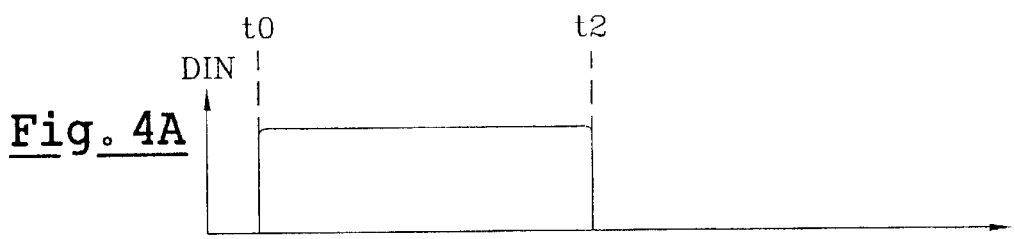
FIGS. 4A to 4E are plots showing the same signals in FIGS. 2A to 2E for illustrating a third exemplary operation of the filtering circuit.
Figure 4B:
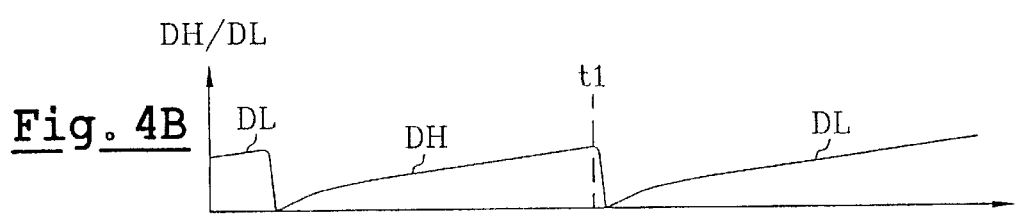
Figure 4C:
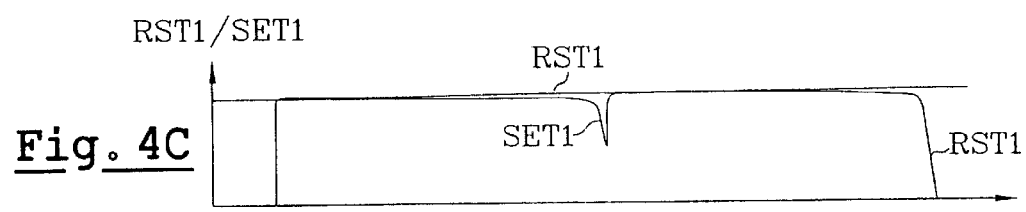
Figure 4D:
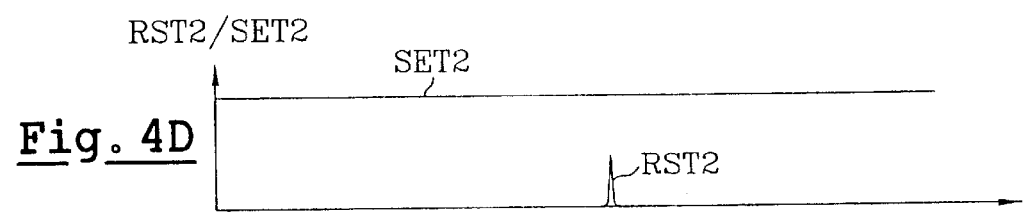
Figure 4E:

FIGS. 2A to 2E, 3A to 3E, and 4A to 4E illustrate the operation of the filtering circuit 10 in three cases as described below (scenarios 1, 2, and 3), and respectively shows:

FIGS. 2A, 3A, 4A: signal DIN,
FIGS. 2B, 3B, 4B: signals DL/DH,
FIGS. 2C, 3C 4C: signals SET1/RST1,
FIGS. 2D, 3D, 4D: signals SET2/RST2,
FIGS. 2E, 3E, 4E: signal DOUT.

In scenario 1, FIGS. 2A to 2E will now be discussed. It is assumed that the input signal DIN goes from 0 to 1 at an instant t0 and remains at 1 for a duration greater than a filtering threshold Tf.

Before the signal DIN goes to 1, the signals IN1 and IN2 are respectively at 1 and at 0. The transistor T2 is on and the transistor T1 is off. The signal DL is at 1 (capacitor C1 is charged) and the signal DH is at 0. The signal SET1 is at 1 at the output of the logic circuit S4 and the signal RST1 is 0 at the output of the logic circuit S3. The signals SET2 and RST2 delivered respectively by the $\overline{Q}$ and Q outputs of the flip-flop circuit FF1 are respectively kept at 1 and at 0. The output signal DOUT delivered by the Q output of the flip-flop circuit FF2 is held at 0 (Table 1).

At the instant t0 when the signal DIN goes to 1, the signals IN1 and IN2 respectively go to 0 and to 1, and the transistor T2 goes off and the transistor T1 comes on. The transistor T1 forces the signal DL to 0 for discharging the capacitor C1, although the signal SET1 at the output of the logic circuit S4 is still at 1. The signal RST1 thus goes to 1 at the output of the logic circuit S3 almost immediately, and the signal DH starts rising because of the charging of the capacitor C2 by the resistor R2. During this period, the signals SET1 and RST1 are simultaneously at 1, which corresponds to the flip-flop circuit FF1 holding or memorizing its output. The signals SET2 and RST2 are thus held at their current value and the signal DOUT remains at 0 at the output of the flip-flop circuit FF2.

At an instant t1, the signal DH reaches the switching threshold Vth of the logic circuit S4 and the signal SET1 goes to 0. With the signal RST1 at the output of the logic circuit S3 remaining at 1, the signals SET2, RST2 delivered by the flip-flop circuit FF1 are inverted, with the signal RST2 going to 1 and the signal SET2 going to 0. The outputs of the flip-flop circuit FF2 are also inverted and the signal DOUT goes to 1, thus copying the signal DIN with a delay equal to the time that has elapsed between the instants t0 and t1. This delay is equal to the filtering threshold Tf, and is determined by the ratio between the slope of the ramp of the signal DH and the switching threshold Vth of the logic circuit S4.

Operation of the circuit 10 is identical when the signal DIN goes from 1 to 0. In this case, a voltage ramp appears at the signal DL and the signal DH remains at 0. The ratio between the threshold Vth of the logic circuit S3 and the slope of the ramp generated by the capacitor C1 is preferably equal to the ratio between the threshold Vth of the logic circuit S4 and the slope of the ramp generated by the capacitor C2. Thus, the circuit 10 has the same filtering threshold Tf when the signal DIN goes from 0 to 1 as when the signal DIN goes from 1 to 0.

In scenario 2, FIGS. 3A to 3E will now be discussed. This example illustrates operation of the circuit 10 at the boundary of the filtering threshold Tf, when the input signal DIN has a pulse at 1 with a duration very close to the threshold Tf but substantially above it. As in the previous cases, the signals SET1 and RST1 are respectively at 1 and at 0 before the signal DIN goes to 1 and the signal DOUT at the Q output of the flip-flop circuit FF2 is held at 0.

At the instant t0, the signal DIN goes to 1, and the signals IN1 and IN2 respectively go to 0 and to 1. As discussed above, the signal DL is forced to 0 and the signal DH starts rising. The signals RST1 and SET1 are both at 1 and the flip-flop circuit FF1 holds its output. The signal DOUT remains at 0 at the output of the flip-flop circuit FF2.

At the instant t1, the signal DH reaches the switching threshold Vth of the logic circuit S4. The signal SET1 goes to 0 (FIG. 3C), the signal RST1 remains at 1, the signals SET2, RST2 at the outputs of the flip-flop circuit FF1 are inverted and the signal DOUT goes to 1 (FIGS. 3D, 3E).

The signal DIN goes back to 0 at an instant t2 very close to t1. The capacitor C2 is discharged by the opening of the transistor-switch T2. This prompts the immediate resetting of the signal DH and the immediate setting of the signal SET1, which has just gone to 0 at the instant t1. If we assume, as indicated above, that the duration of the pulse of the signal DIN is very close to Tf, it can be seen in FIG. 3C that the signal SET1 has not quite reached the logic 0 when it is reset at the instant t2. However, the low value reached by the signal SET1 before the instant t2 is sufficient here to cause the switching over of the $\overline{Q}$ output and then the Q output of the flip-flop circuit FF1.

After the instant t2, the output signal DOUT is held at 1 because the control signals SET1 and RST1 are at 1 and hold the flip-flop circuit FF1 in the memorization state. Furthermore, the signal DL has a voltage ramp because of the charging of the capacitor C1.

At the instant t3, the signal DL reaches the threshold Vth of the logic circuit S3 and the signal RST1 goes to 0. The outputs of the flip-flop circuit FF1 are inverted again, the signal RST2 goes back to 0, the signal SET2 goes back to 1 and the output signal DOUT goes back to 0. Thus, in FIGS. 3A and 3E, it can be seen that the signal DOUT delivered by the filtering circuit 10 copies the pulse of the signal DIN with a time lag equal to Tf due to the filtering performed.

In scenario 3, FIGS. 4A to 4E will now be discussed. It is now assumed that the input signal DIN has a pulse at 1 with a duration substantially equal to Tf. Operation of circuit 10 is substantially the same as above, up to the instant t2. However in this case, the instant t2 is far too close to the instant t1 for the signal SET1 at the output of the logic circuit S4 to have the time to completely switch over to 0 before going back to 1.

Thus, in FIG. 4C, the signal SET1 is reset at 1 before it has reached a value low enough to prompt a change in the state of the flip-flop circuit FF1. More particularly, FIG. 4D shows that the signal RST2 of the Q output of the flip-flop circuit FF1 tends towards 1 for a very short instant and has the shape of a peak. This peak is not enough to make the signal SET1 switch over to the Q output of the flip-flop circuit FF1, so that this flip-flop circuit keeps its initial state, as does the flip-flop circuit FF2. Consequently, the signal DOUT remains at 0 and the pulse of the input signal DIN is entirely filtered.

From this example, the flip-flop circuit FF2 is an additional and optional filtering element through which the output of the circuit 10 does not have a brief variation peak in a borderline case such as this one. Thus, if the Q output of the flip-flop circuit FF1 were to be used as an output of the circuit 10, the signal RST2 would be the output signal DOUT and would have the peak seen in FIG. 4D.

Preferably, the NAND gates of the flip-flop circuit FF2 have a low switching threshold at input that is below the threshold of the NAND gates of the flip-flop circuit FF1. Thus, it may happen in a case that is even more of a borderline example than the one just described that the signal SET2 has a brief peak towards 0 in FIG. 4D that is similar to the peak towards 1 of the signal RST2 (FIG. 4D), without thereby causing the switching of the flip-flop circuit FF2. In general, the input sensitivity of the flip-flop circuit FF2 has to be chosen so that this flip-flop circuit switches over only when the variations of the signals SET2 and RST2 are sufficient also to prompt the switching of the flip-flop circuit FF1.

Naturally, below this borderline case, when the input signal DIN has a shorter pulse than the time Tf needed for the signal DH to reach the threshold Vth, the logic circuit S4 does not switch over and the pulse is entirely filtered by the stage formed by the logic circuits S3 and S4.

Operation of the circuit 10 has been described above in considering a pulse at 1 of the input signal DIN. Operation of the circuit 10 is of course similar for pulses at 0 of the input signal DIN. In this case, a voltage ramp appears at the signal DL when the input signal DIN goes to 0 and the signal DH is forced to 0. Operation of the circuit 10 is also similar when a sequence of recurrent or random pulses is applied to its input. Each pulse may be filtered or not filtered according to its duration, independently of the following pulses.

In general, the filtering method according to the invention has the same efficiency as a purely digital filtering operation since it entirely eliminates a parasitic signal with a duration smaller than Tf. Advantageously, such a filtering does not require any computation means and relies on the use of ramp generator circuits and logic circuits whose cost and space requirement is limited. The filtering precision that can be obtained is less than one nanosecond between the two borderline cases illustrated by the scenarios 2 and 3.

Alternative embodiments and applications will now be discussed. The filtering circuit 10 according to the invention is of course open to various alternatives and embodiments. In particular, the ramp-generator circuits may be capacitor-discharging circuits or any other known circuit used to generate a ramp. Here, the term "ramp" of course designates a non-linear ramp (an exponential ramp followed by a flat level) since it relates to the charging or discharging of the capacitor. However, many other types of ramp generators, both linear and non-linear, may be implemented by those skilled in the art. Similarly, the logic circuits S3 and S4 may be made by any type of logic gate having a switching threshold.

Figure 5:
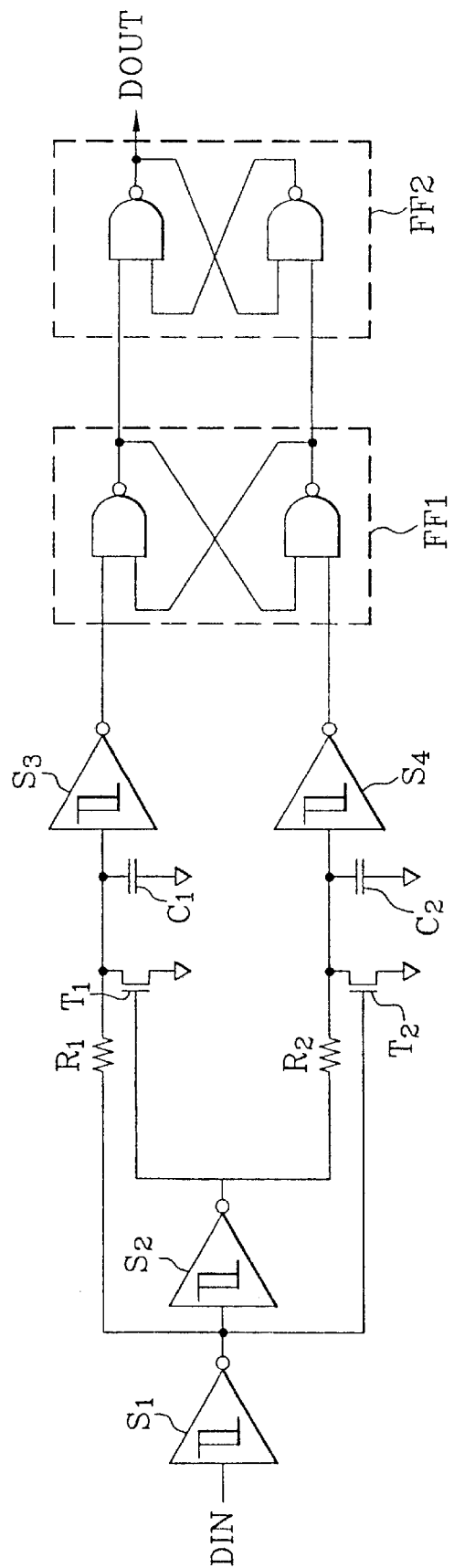
FIG. 5 is a schematic diagram of an alternative embodiment of the filtering circuit according to the present invention.

In one alternative embodiment shown in FIG. 5, the resistor R1 is connected to the output of the inverter gate S1 instead of being connected to the output of the logic circuit S4, and the resistor R2 is connected to the output of the inverter gate S2 instead of being connected to the output of the logic circuit S3. This embodiment operates in the same manner as the one shown in FIG. 1.

The filtering circuit according to the present invention may also be used for various applications. In particular, it may be designed to be used as an input buffer in an integrated circuit receiving an external frequency setting signal, wherein the frequency of this signal must not exceed a certain limit. Thus, apart from an application to serial memories receiving an external clock signal, applications to synchronous smart cards or to microprocessors can also be planed.

That which is claimed is:

1. A filtering circuit for filtering variation of a logic signal and comprising:

first ramp means for delivering a first ramp-shaped signal when the logic signal goes from a first value to a second value, and for returning the first ramp-shaped signal to an initial value when the logic signal goes from the second value to the first value;

second ramp means for delivering a second ramp-shaped signal when the logic signal goes from the second value to the first value, and for returning the second ramp-shaped signal to an initial value when the logic signal goes from the first value to the second value;

a first logic circuit with a switching threshold and having an input for receiving the first ramp-shaped signal;

a second logic circuit with a switching threshold and having an input for receiving the second ramp-shaped signal; and memorization means for delivering an output signal having a first value when signals delivered by said first and second logic circuits have a first pair of values, and a second value when the signals delivered by said first and second logic circuits have a second pair of values, said memorization means comprising a first flip-flop circuit having a resetting input for receiving an output signal from one of said first and second logic circuits, and a setting input for receiving an output signal from the other one of said first and second logic circuits, and a second flip-flop circuit having a resetting input for receiving the output signal from said first flip-flop circuit, a setting input for receiving an inverted output signal from said first flip-flop circuit, and an output for providing the output signal.

2. A filtering circuit according to claim 1, wherein said first and second flip-flop circuits each comprises at least one logic gate, with said at least one logic gate of said second flip-flop circuit having a trip point different from a trip point of said at least one logic gate of said first flip-flop circuit so that said second flip-flop circuit trips after said first flip-flop circuit has tripped.

3. A filtering circuit according to claim 1, wherein respective slopes of the first and second ramp-shaped signals are substantially identical; and wherein the respective switching thresholds of said first and second logic circuits are substantially identical.

4. A filtering circuit according to claim 1, wherein said first ramp means comprises:

a first capacitive circuit; and a first switch connected to said first capacitive circuit for controlling charging and discharging thereof when the first ramp-shaped signal is to return to the initial value; and wherein said second ramp means comprises:

a second capacitive circuit; and a second switch connected to said second capacitive circuit for controlling charging and discharging thereof when the second ramp-shaped signal is to return to the initial value.

5. A filtering circuit according to claim 4, wherein said first switch receives an inverted logic signal; and wherein said second switch receives the logic signal.

6. A filtering circuit according to claim 4, wherein an input of said first capacitive circuit is connected to an output of said second logic circuit; and wherein an input of said second capacitive circuit is connected to an output of said first logic circuit.

7. A filtering circuit according to claim 1, wherein each of said first and second logic circuits has a switching hysteresis.

8. A filtering circuit according to claim 1, wherein each of said first and second logic circuits comprises an inverter.

9. A filtering circuit for filtering variation of a logic signal and comprising:
- a first ramp circuit for delivering a first ramp-shaped signal in response to a first type of variation of the logic signal;
- a second ramp circuit for delivering a second ramp-shaped signal in response to a second type of variation of the logic signal;
- a first logic circuit with a switching threshold and having an input for receiving the first ramp-shaped signal;
- a second logic circuit with a switching threshold and having an input for receiving the second ramp-shaped signal; and
- an output circuit for delivering an output signal having a first value when signals delivered by said first and second logic circuits have a first pair of values, and a second value when the signals delivered by said first and second logic circuits have a second pair of values, said output circuit comprising
  - a first flip-flop circuit having a resetting input for receiving an output signal from one of said first and second logic circuits, and a setting input for receiving an output signal from the other one of said first and second logic circuits, and
  - a second flip-flop circuit having a resetting input for receiving the output signal from said first flip-flop circuit, a setting input for receiving an inverted output signal from said first flip-flop circuit, and an output for providing the output signal.

10. A filtering circuit according to claim 9, wherein said first ramp circuit delivers the first ramp-shaped signal when the logic signal goes from a first value to a second value, and returns the first ramp-shaped signal to an initial value when the logic signal goes from the second value to the first value; and wherein said second ramp circuit delivers the second ramp-shaped signal when the logic signal goes from the second value to the first value, and returns the second ramp-shaped signal to an initial value when the logic signal goes from the first value to the second value.

11. A filtering circuit according to claim 9, wherein said first and second flip-flop circuits each comprises at least one logic gate, with said at least one logic gate of said second flip-flop circuit having a trip point different from a trip point of said at least one logic gate of said first flip-flop circuit so that said second flip-flop circuit trips after said first flip-flop circuit has tripped.

12. A filtering circuit according to claim 9, wherein said first ramp circuit comprises:
- a first capacitive circuit; and
- a first switch connected to said first capacitive circuit for controlling charging and discharging thereof when the first ramp-shaped signal is to return to an initial value; and
wherein said second ramp circuit comprises:
- a second capacitive circuit; and
- a second switch connected to said second capacitive circuit for controlling charging and discharging thereof when the second ramp-shaped signal is to return to an initial value.

13. A filtering circuit according to claim 9, wherein respective slopes of the first and second ramp-shaped signals are substantially identical; and wherein the respective switching thresholds of said first and second logic circuits are substantially identical.

14. A filtering circuit according to claim 12, wherein said first switch receives an inverted logic signal; and wherein said second switch receives the logic signal.

15. A filtering circuit according to claim 12, wherein an input of said first capacitive circuit is connected to an output of said second logic circuit; and wherein an input of said second capacitive circuit is connected to an output of said first logic circuit.

16. A filtering circuit according to claim 9, wherein each of said first and second logic circuits has a switching hysteresis.

17. A filtering circuit according to claim 9, wherein each of said first and second logic circuits comprises an inverter.

18. An integrated circuit comprising:
- an input for receiving an external clock signal; and
- a filtering circuit connected to the input for filtering variation of the external clock signal and comprising
  - a first ramp circuit for delivering a first ramp-shaped signal in response to a first type of variation of the external clock signal,
  - a second ramp circuit for delivering a second ramp-shaped signal in response to a second type of variation of the external clock,
  - a first logic circuit with a switching threshold and having an input for receiving the first ramp-shaped signal,
  - a second logic circuit with a switching threshold and having an input for receiving the second ramp-shaped signal, and
  - an output circuit for delivering an output signal having a first value when signals delivered by said first and second logic circuits have a first pair of values, and a second value when the signals delivered by said first and second logic circuits have a second pair of values, said output circuit comprising
    - a first flip-flop circuit having a resetting input for receiving an output signal from one of said first and second logic circuits, and a setting input for receiving an output signal from the other one of said first and second logic circuits, and
    - a second flip-flop circuit having a resetting input for receiving an output signal from said first flip-flop circuit, a setting input for receiving an inverted output signal from said first flip-flop circuit, and an output for providing the output signal.

19. An integrated circuit according to claim 18, wherein said first ramp circuit delivers the first ramp-shaped signal when the external clock signal goes from a first value to a second value, and returns the first ramp-shaped signal to an initial value when the external clock signal goes from the second value to the first value; and wherein said second ramp circuit delivers the second ramp-shaped signal when the external clock signal goes from the second value to the first value, and returns the second ramp-shaped signal to an initial value when the external clock signal goes from the first value to the second value.

20. An integrated circuit according to claim 18, wherein said first and second flip-flop circuits each comprises at least one logic gate, with said at least one logic gate of said second flip-flop circuit having a trip point different from a trip point of said at least one logic gate of said first flip-flop circuit so that said second flip-flop circuit trips after said first flip-flop circuit has tripped.

21. An integrated circuit according to claim 18, wherein said first ramp circuit comprises:

a first capacitive circuit; and a first switch connected to said first capacitive circuit for controlling charging and discharging thereof when the first ramp-shaped signal is to return to an initial value; and wherein said second ramp circuit comprises:

a second capacitive circuit; and a second switch connected to said second capacitive circuit for controlling charging and discharging thereof when the second ramp-shaped signal is to return to an initial value.

22. A method for filtering variation of a logic signal comprising:

generating a first ramp-shaped signal in response to a first type of variation of the logic signal;

generating a second ramp-shaped signal in response to the second type of variation of the logic signal;

applying the first ramp-shaped signal to a first logic circuit having a switching threshold;

applying the second ramp-shaped signal to a second logic circuit having a switching threshold; and generating an output signal having a first value when output signals of the first and second logic circuits have a first pair of values, and a second logic value when the output signals of the first and second logic circuit have a second pair of values, the generating being performed by a first flip-flop circuit having a resetting input for receiving an output signal from one of the first and second logic circuits, and a setting input for receiving an output signal from the other one of the first and second logic circuits, and a second flip-flop circuit having a resetting input for receiving the output signal from the first flip-flop circuit, a setting input for receiving an inverted output signal from the first flip-flop circuit, and an output for providing the output signal.

23. A method according to claim 22, wherein generating the first ramp-shaped signal further comprises returning the first ramp-shaped signal to an initial value when the logic signal has the second type of variation that is a reverse of the first type; and wherein generating the second ramp-shaped signal further comprises returning the second ramp-shaped signal to an initial value when the logic signal has the first type of variation.

24. A method according to claim 22, further comprising maintaining the output signal at a current value when the output signals of the first and second logic circuits have a pair of values different from the first and second pairs of values.

25. A method according to claim 22, wherein each of the first and second logic circuits has a switching hysteresis.

26. A method according to claim 22, wherein generating the first ramp-shaped signal is generated by a first capacitive circuit, and the method further comprises controlling charging and discharging thereof using a first switch when the first ramp-shaped signal is to return to an initial value; and wherein generating the second ramp-shaped signal is generated by a second capacitive circuit, and the method further comprises controlling charging and discharging thereof using a second switch when the second ramp-shaped signal is to return to an initial value.

* * * * *

UNITED STATES PATENT AND TRADEMARK OFFICE
CERTIFICATE OF CORRECTION

PATENT NO.   : 6,507,221 B2
DATED        : January 14, 2003
INVENTOR(S)  : Francesco La Rosa It is certified that error appears in the above-identified patent and that said Letters Patent is hereby corrected as shown below:

Title page,
Item [73], delete "StMicroelectronics S.A." insert -- STMicroelectronics S.A. --
Item [56], insert -- OTHER PUBLICATIONS
Vitunic, "Pulse Discriminator Excises Narrow Pulses" EDN Electrical Design News, US, Cahners Publishing Co., Newton, Massachusetts, vol. 42, no. 24, November 20, 1997, page 102, XP000767140 --

Column 6,
Line 59, delete "to the Q output" insert -- to the $\overline{Q}$ output --

Column 11,
Line 26, delete "circuit" insert -- circuits --

Signed and Sealed this

Ninth Day of September, 2003

JAMES E. ROGAN
*Director of the United States Patent and Trademark Office*